(12) United States Patent
Chang et al.

(10) Patent No.: US 8,420,421 B2
(45) Date of Patent: Apr. 16, 2013

(54) METHOD FOR FABRICATING A GAN-BASED THIN FILM TRANSISTOR

(75) Inventors: Yi Chang, Hsinchu (TW); Chia-Hua Chang, Taichung (TW); Yueh-Chin Lin, New Taipei (TW)

(73) Assignee: National Chiao Tung University, Hsinchu (TW)

( * ) Notice: Subject to any disclaimer, the term of this patent is extended or adjusted under 35 U.S.C. 154(b) by 153 days.

(21) Appl. No.: 13/117,428

(22) Filed: May 27, 2011

(65) Prior Publication Data

US 2012/0122281 A1    May 17, 2012

(30) Foreign Application Priority Data

Nov. 12, 2010  (TW) ................................ 99139011 A

(51) Int. Cl.
  *H01L 21/00* (2006.01)
(52) U.S. Cl.
  USPC ............................................................ 438/38
(58) Field of Classification Search ...................... 438/38
  See application file for complete search history.

(56) References Cited

U.S. PATENT DOCUMENTS

| 7,655,962 B2 | 2/2010 | Simin ........................... 257/192 |
| 8,163,581 B1 * | 4/2012 | Or-Bach et al. .................. 438/39 |
| 2007/0295993 A1 | 12/2007 | Chen ............................. 257/194 |

* cited by examiner

*Primary Examiner* — Charles Garber
*Assistant Examiner* — Andre' C Stevenson
(74) *Attorney, Agent, or Firm* — Ladas & Parry LLP

(57) ABSTRACT

A method for fabricating a GaN-based thin film transistor includes: forming a semiconductor epitaxial layer on a substrate, the semiconductor epitaxial layer having a n-type GaN-based semiconductor material; forming an insulating layer on the semiconductor epitaxial layer; forming an ion implanting mask on the insulating layer, the ion implanting mask having an opening to partially expose the insulating layer; ion-implanting a p-type impurity through the opening and the insulating layer to form a p-doped region in the n-type GaN-based semiconductor material, followed by removing the insulating layer and the ion implanting mask; forming a dielectric layer on the semiconductor epitaxial layer; partially removing the dielectric layer; forming source and drain electrodes; and forming a gate electrode.

7 Claims, 5 Drawing Sheets

METHOD FOR FABRICATING A GAN-BASED THIN FILM TRANSISTOR

CROSS-REFERENCE TO RELATED APPLICATIONS

This application claims priority of Taiwanese Patent Application No. 099139011 filed on Nov. 12, 2010, the disclosures of which is incorporated herein by reference.

BACKGROUND OF THE INVENTION

1. Field of the Invention

This invention relates to a method for fabricating a gallium nitride-based (GaN-based) thin film transistor, more particularly to a method for fabricating an enhancement mode (E-mode) GaN-based thin film transistor.

2. Description of the Related Art

Referring to FIG. 1, a conventional GaN-based thin film transist or includes a substrate 11, a semiconductor layer 12, a dielectric layer 13 disposed on a top surface of the semiconductor layer 12, source and drain electrodes 15, 16 respectively formed on two opposite sides of the dielectric layer 13, and a gate electrode 14 disposed on a top surface of the dielectric layer 13 and between the source and drain electrodes 15, 16. The semiconductor layer 12 includes, from bottom to top, a first GaN epitaxial film 121 formed on the substrate 11, an aluminum gallium nitride (AlGaN) epitaxial film 122, and a second GaN epitaxial film 123 connected to the dielectric layer 13.

In the conventional GaN-based thin film transistor, since two dimensional electron gas (2DEG) is induced by a mass of polarization charges in the first GaN epitaxial film 121 and the AlGaN epitaxial film 122, the transistor is required to be operated in a depletion-mode. Such transistor is also referred to as a "normally on" transistor. The "normally on" transistor has a negative threshold voltage, and thus, consumes power even at zero gate bias. This results in additional power loss. Besides, when the transistor is used in a high power circuit system, a transient pulse voltage is likely to occur since the high power circuit system is required to be operated at an extremely high bias voltage. A malfunction of the high power circuit system caused by the "abnormally on" state of the high power element (the transistor) tends to occur due to insufficient high threshold voltage of the transistor. Hence, the stability of the high power circuit system may be adversely affected.

In order to provide an improved GaN thin film transistor that has a relatively high threshold voltage, an improved high voltage endurance, and a relatively high power output, and that is operated at an enhancement mode (E-mode), U.S. Pat. No. 7,655,962 discloses an enhancement mode transistor including a bottom AlInGaN barrier layer disposed under an AlInGaN channel layer so that polarization charges of the bottom barrier layer deplete charges in the channel layer. The transistor of U.S. Pat. No. 7,655,962 also includes a gate electrode formed as a deep recessed gate so that the transistor is in the off state at zero gate bias.

Furthermore, U.S. Patent Application Publication No. 2007/0295993 discloses a high electron mobility transistor made by introducing fluorine ions into an AlInGaN channel layer using a $CF_4$ plasma treatment to effectively deplete charges in the AlInGaN channel layer. Accordingly, the transistor is in the off state at zero gate bias, and can serve as an E-mode transistor.

However, formation of the deep recessed gate described in U.S. Pat. No. 7,655,962 requires a surface etching process. This may result in an increased surface state density of the transistor that is likely to adversely affect current characteristics and reliability of the transistor. Besides, although the threshold voltage of the transistor described in U.S. Patent Application Publication No. 2007/0295993 can be increased by introducing the fluorine ions using the $CF_4$ plasma treatment, it can be increased only by 0.9 volt due to a limited diffusion capability of the fluorine ions, and is thus unsatisfactory.

SUMMARY OF THE INVENTION

Therefore, an object of the present invention is to provide a method for fabricating a GaN-based thin film transistor that can overcome the aforesaid drawbacks associated with the prior art.

Accordingly, a method for fabricating a GaN-based thin film transistor of this invention comprises:

forming a semiconductor epitaxial layer on a substrate, the semiconductor epitaxial layer having a n-type GaN-based semiconductor material;

forming an insulating layer on the semiconductor epitaxial layer;

forming an ion implanting mask on the insulating layer, the ion implanting mask having an opening to partially expose the insulating layer;

ion-implanting a p-type impurity through the opening and the insulating layer to form a p-doped region in the n-type GaN-based semiconductor material, followed by removing the insulating layer and the ion implanting mask;

forming a dielectric layer on the semiconductor epitaxial layer;

partially removing the dielectric layer so that two portions of the semiconductor epitaxial layer that are located on two opposite sides of the p-doped region are exposed from the dielectric layer;

forming source and drain electrodes respectively on the two portions of the semiconductor epitaxial layer; and forming a gate electrode on a remaining portion of the dielectric layer.

BRIEF DESCRIPTION OF THE DRAWINGS

Other features and advantages of the present invention will become apparent in the following detailed description of the preferred embodiment of the invention, with reference to the accompanying drawings, in which.

DETAILED DESCRIPTION OF THE PREFERRED EMBODIMENT

Figure 1:
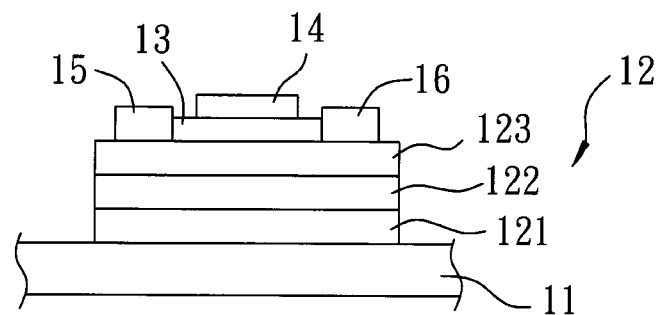
FIG. 1 is a schematic view of a conventional GaN-based thin film transistor.
Figure 2:
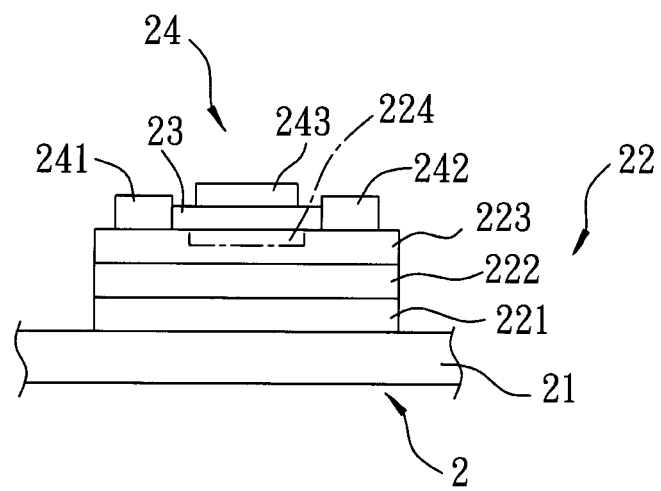
FIG. 2 is a schematic view of the preferred embodiment of a GaN-based thin film transistor according to the present invention.
Figure 14:
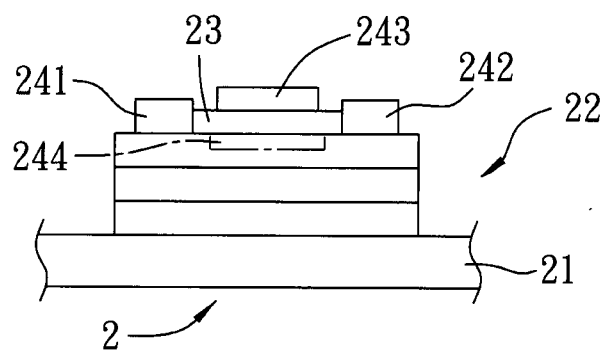

A GaN-based thin film transistor 2 made by the preferred embodiment of the method for fabricating a GaN-based thin film transistor according to this invention is shown in FIGS. 2 and 14.

The GaN-based thin film transistor 2 includes a substrate 21, a semiconductor epitaxial layer 22, a dielectric layer 23, and an electrode unit 24.

The substrate 21 may be made of a transparent or non-transparent insulating material, such as sapphire, silicon, or silicon carbide. Because the materials suitable for making the substrate 21 and the semiconductor epitaxial layer 22 are well-known in the relevant art and can be selected by a skilled artisan based on the intended use, detailed descriptions thereof are omitted for the sake of brevity.

In the preferred embodiment, the substrate 21 is made of sapphire. The semiconductor epitaxial layer 22 is made of a n-type GaN-based semiconductor material, and includes, from bottom to top, a first GaN epitaxial film 221 formed on the substrate 21, an AlGaN epitaxial film 222, a second GaN epitaxial film 223, and a p-doped region 224 formed in the second GaN epitaxial film 223 and extending downwardly from a top surface of the second GaN epitaxial film 223.

The dielectric layer 23 is formed on the top surface of the second GaN epitaxial film 223 to cover the p-doped region 224, and is made of a material having a relatively high dielectric constant. Accordingly, the numbers of carriers and charges in the AlGaN epitaxial film 222 can be increased to raise the threshold voltage of the transistor. Examples of the materials suitable for the dielectric layer 23 include $Al_2O_3$, $HfO_2$, $La_2O_3$, $CeO_2$, HfAlO, $TiO_2$, and $ZrO_2$.

The electrode unit 24 is made of a conductive material, and includes a source electrode 241, a drain electrode 242, and a gate electrode 243. The source and drain electrodes 241, 242 are formed on the top surface of the second GaN epitaxial film 223 so as to be respectively disposed on two opposite sides of the dielectric layer 23. The gate electrode 243 is formed on a surface of the dielectric layer 23 opposite to the p-doped region 224.

The GaN-based semiconductor material itself has a n-type property that has electrons as major carriers, and thus, a p-n junction is formed between the p-doped region 224 and the second GaN epitaxial film 223. Since the p-n junction in the semiconductor epitaxial layer 22 produces an internal p-n junction voltage, and since the dielectric layer 23 is formed on the p-doped region 224, the threshold voltage of the transistor according to the present invention can be effectively increased and current leakage of the transistor may be alleviated. Furthermore, the drain output current and trans conductance of the transistor can also be improved, and thus, the transistor of this invention can serve as an E-mode transistor for next generation high efficiency and high voltage driving and controlling circuit system.

Figure 3:
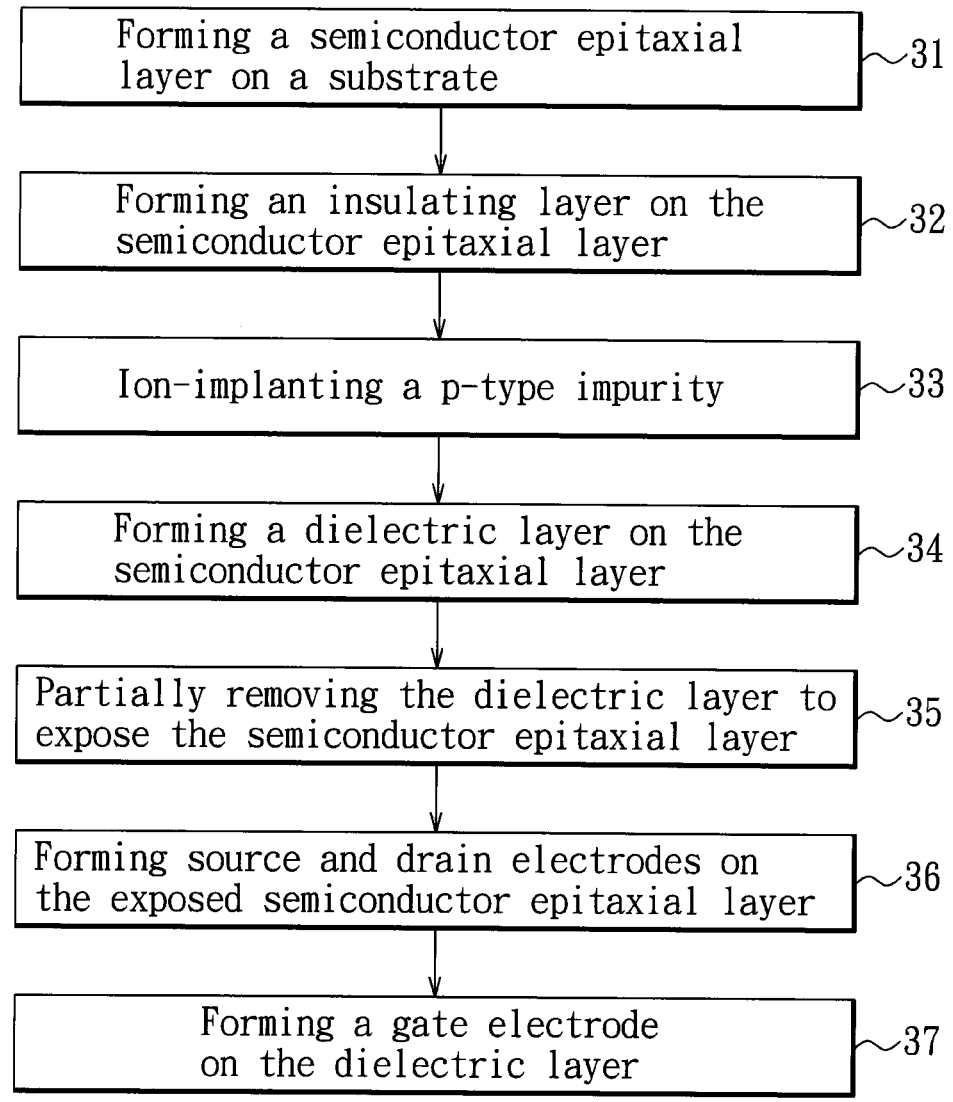
FIG. 3 is a flow chart showing the preferred embodiment of a method for fabricating a GaN-based thin film transistor according to the present invention.

The GaN-based thin film transistor is explained in more detail below through steps of the method for fabricating the GaN-based thin film transistor according to this invention (see FIG. 3).

Figure 4:
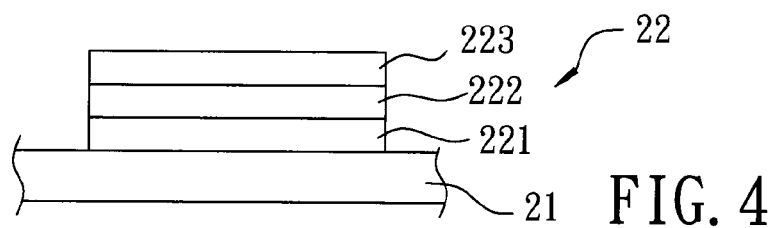
FIGS. 4 to 14 are schematic views illustrating successive steps of the method for fabricating a GaN-based thin film transistor according to the present invention.

In step 31, the semiconductor epitaxial layer 22 is formed on the substrate 21 made of sapphire. In this step, the semiconductor epitaxial layer 21 includes a three-layer structure of the first GaN epitaxial film 221 formed on the substrate 21, the AlGaN epitaxial film 222, and the second GaN epitaxial film 223 in that order (see FIG. 4).

Figure 5:
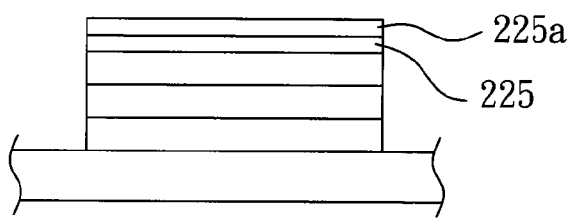
Figure 6:
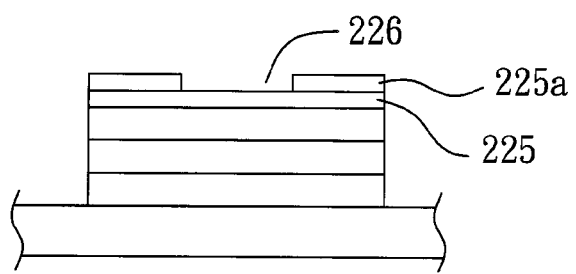

In step 32, an insulating layer 225 is formed on the second GaN epitaxial film 223 of the semiconductor epitaxial layer 22, and an ion implanting mask 225a is formed on the insulating layer 225 (see FIG. 5). Thereafter, the ion implanting mask 225a is formed to have the opening 226 using a lithography process to partially expose the insulating layer 225 (see FIG. 6). In this step, the insulating layer 225 is formed using plasma enhanced chemical vapor deposition (PECVD), and is made of silicon dioxide, silicon nitride, aluminum oxide, or other insulating materials. The ion implanting mask 225a is formed by coating a photoresist material that may be a positive-type or a negative-type on the insulating layer 225, followed by a lithography process to form the opening 226. The selection of the photoresist material and the lithography process are well-known to the skilled artisan, and detailed descriptions thereof are omitted for the sake of brevity.

It should be noted that the insulating layer 225 has a thickness arranged to control a depth of the p-doped region 224 so that the p-doped region 224 is formed only in the second GaN epitaxial film 223. If the thickness of the insulating layer 225 is overly large, ions (i.e., p-type impurities) cannot be doped in the semiconductor epitaxial layer 22. If the insulating layer 225 is overly thin, the ions may extend through a predetermined region for ion implanting (i.e., the p-n junction cannot be formed). Preferably, the thickness of the insulating layer 225 is not less than 50 nm. More preferably, the thickness of the insulating layer 225 ranges from 50 nm to 150 nm.

Figure 7:
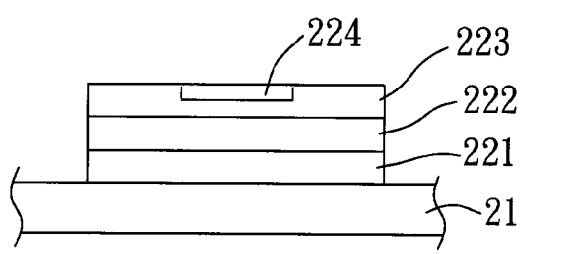

In step 33, a p-type impurity is ion-implanted through the opening 226 and the insulating layer 225 to form the p-doped region 224 in the second GaN epitaxial film 223, followed by removing the insulating layer 225 and the ion implanting mask 225a (see FIG. 7).

Specifically, the p-type impurity is selected from ions for forming the p-doped region 224 in a GaN material, such as magnesium ions, boron ions, etc.

It should be noted that if the p-doped region 224 has a thickness that is overly large, formation of a two dimensional electron gas (2DEG) channel by virtue of the second GaN epitaxial film 223 and the AlGaN epitaxial film 222 would be adversely affected. If the thickness of the p-doped region 224 is not enough, the threshold voltage (i.e., the turn-on voltage) of the transistor cannot be effectively increased. Preferably, the thickness of the p-doped region 224 is less than one-half of a thickness of the second GaN epitaxial film 223.

Figure 8:
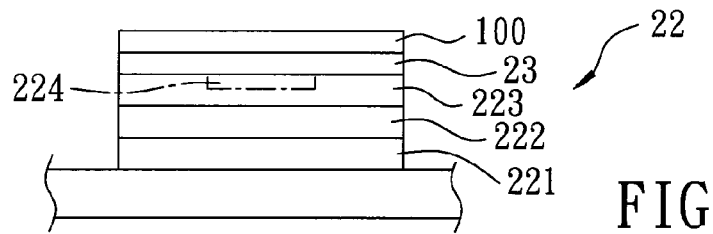

In step 34, the dielectric layer 23 is formed on the semiconductor epitaxial layer 22 (see FIG. 8).

Figure 9:
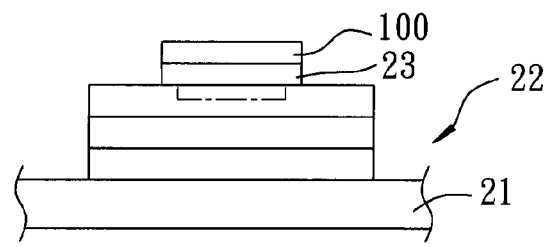

Thereafter, in step 35, the dielectric layer 23 is partially removed according to the following sub-steps. A photoresist 100 is formed on the dielectric layer 23 (see FIG. 8). Then, the photoresist 100 is processed by lithography to cover a portion of the dielectric layer 23 that is located above the p-doped region 224, and the dielectric layer 23 exposed from the photoresist 100 is removed (see FIG. 9). Accordingly, two portions of the semiconductor epitaxial layer 22 that are located on two opposite sides of the p-doped region 224 are exposed from the dielectric layer 23.

Figure 10:
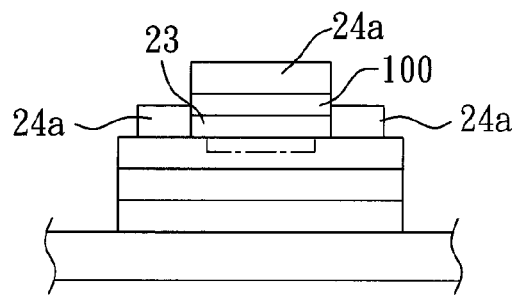
Figure 11:
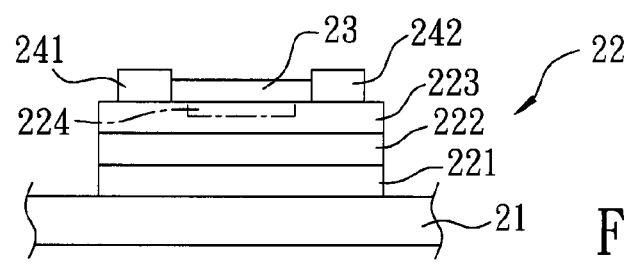

In step 36, the source and drain electrodes 241, 242 are respectively formed on the two portions of the semiconductor epitaxial layer 22 according to the following sub-steps. In detail, the source and drain electrodes 241, 242 shown in FIG. 11 are formed by depositing a metal material 24a on the photoresist 100 and the two portions of the semiconductor epitaxial layer 22 (see FIG. 10), followed by removing the photoresist 100.

Figure 12:
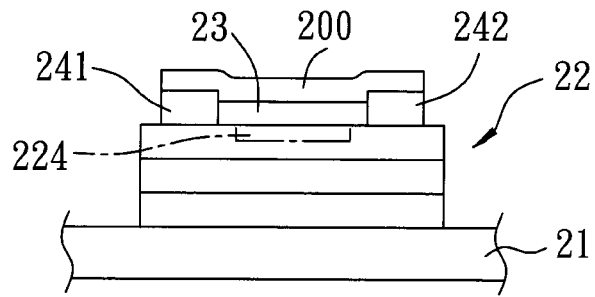
Figure 13:
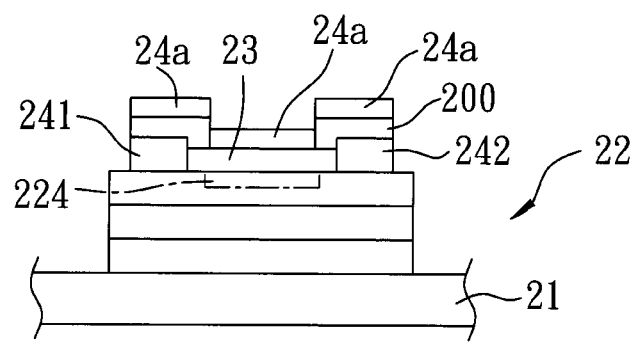

In step 37, the gate electrode 243 is formed on a remaining portion of the dielectric layer 23 to obtain the GaN-based thin film transistor 2. In detail, the gate electrode 243 shown in FIG. 14 is formed by: forming a photoresist 200 to cover the remaining portion of the dielectric layer 23, and the source and drain electrodes 241, 242 (see FIG. 12); partially removing a portion of the photoresist 200 using lithography to partially expose the remaining portion of the dielectric layer 23, the removed portion of the photoresist 200 being aligned with the p-doped region 224; depositing the metal material 24a on the exposed dielectric layer 23 and the remaining photoresist 200 (see FIG. 13); and removing the photoresist 200 and the metal material 24a on the photoresist 200 to obtain the gate electrode 243 (see FIG. 14).

Preferably, the method of this invention further includes a step of introducing fluorine ions to the AlGaN epitaxial film 222 through the opening 226 by $CF_4$ plasma treating, before the step of ion-implanting (step 33). Accordingly, the threshold voltage (i.e., the turn-on voltage) of the transistor 2 can be further increased.

In summary, the transistor 2 of this invention is made by directly ion-implanting the p-type impurity in the n-type GaN-based semiconductor material to obtain the p-n junction that can produce the internal p-n junction voltage to increase the threshold voltage of the transistor 2. Thus, the transistor 2 of this invention, which is relatively easy to make and to control, can be operated at the E-mode. Besides, since the p-doped region 224 is formed by ion-implanting, it is not necessary to form a p-type epitaxial film on the n-type GaN-based semiconductor material, which may cause a problem of interfacial defects. Furthermore, since the transistor 2 of this invention is not formed by the conventional method, a problem of increased defect density due to an etching process for forming the deep recessed gate as in the prior art, or a problem that a relatively high threshold voltage is unable to be achieved even through the use of plasma treatment can be avoided. On the other hand, because the dielectric layer 23 of the transistor 2 of this invention has the relatively high dielectric constant, the threshold voltage of the transistor 2 can be further increased and current leakage can be alleviated. Therefore, the transistor 2 of this invention has a relatively low standby power loss, and can be easily applied to an electric system, such as the next-generation high efficiency and high voltage driving and controlling circuit system to serve as an E-mode transistor.

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangements.

What is claimed is:

1. A method for fabricating a GaN-based thin film transistor, comprising:

forming a semiconductor epitaxial layer on a substrate, the semiconductor epitaxial layer having a n-type GaN-based semiconductor material;

forming an insulating layer on the semiconductor epitaxial layer;

forming an ion implanting mask on the insulating layer, the ion implanting mask having an opening to partially expose the insulating layer;

ion-implanting a p-type impurity through the opening and the insulating layer to form a p-doped region in the n-type GaN-based semiconductor material, followed by removing the insulating layer and the ion implanting mask;

forming a dielectric layer on the semiconductor epitaxial layer;

partially removing the dielectric layer so that two portions of the semiconductor epitaxial layer that are located on two opposite sides of the p-doped region are exposed from the dielectric layer;

forming source and drain electrodes respectively on the two portions of the semiconductor epitaxial layer; and forming a gate electrode on a remaining portion of the dielectric layer.

2. The method of claim 1, wherein the semiconductor epitaxial layer includes, from bottom to top, a first GaN epitaxial film formed on the substrate, an AlGaN epitaxial film, and a second GaN epitaxial film.

3. The method of claim 2, wherein the insulating layer has a thickness arranged to limit a depth of the p-doped region so that the p-doped region is formed only in the second GaN epitaxial film.

4. The method of claim 3, wherein the p-doped region has a thickness less than one-half of a thickness of the second GaN epitaxial film.

5. The method of claim 2, further comprising a step of introducing fluorine ions to the AlGaN epitaxial film through the opening by plasma treating, before the step of ion-implanting.

6. The method of claim 3, wherein the insulating layer is made of one of silicon dioxide and silicon nitride, and has the thickness ranging from 50 nm to 150 nm.

7. The method of claim 1, wherein the dielectric layer is made of a material selected from the group consisting of $Al_2O_3$, $HfO_2$, $La_2O_3$, $CeO_2$, HfA10, $TiO_2$, and $ZrO_2$.

* * * * *